(12) United States Patent
Cideciyan et al.

(10) Patent No.: US 9,176,817 B2
(45) Date of Patent: *Nov. 3, 2015

(54) DATA MANAGEMENT IN SOLID STATE STORAGE DEVICES

(75) Inventors: Roy D. Cideciyan, Rueschlikon (CH); Evangelos S. Eleftheriou, Rueschilikon (CH); Robert Haas, Rueschlikon (CH); Xiao-Yu Hu, Rueschlikon (CH); Ilias Iliadis, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 471 days.

This patent is subject to a terminal disclaimer.

(21) Appl. No.: 13/617,571

(22) Filed: Sep. 14, 2012

(65) Prior Publication Data

US 2013/0013980 A1 Jan. 10, 2013

Related U.S. Application Data

(63) Continuation of application No. 13/516,053, filed on Jun. 14, 2012, now Pat. No. 8,904,261.

(30) Foreign Application Priority Data

Dec. 17, 2009 (EP) ..................................... 09179746

(51) Int. Cl.
*G11C 29/00* (2006.01)
*G06F 11/10* (2006.01)
*H03M 13/05* (2006.01)

(52) U.S. Cl.
CPC .......... *G06F 11/108* (2013.01); *G06F 11/1068* (2013.01); *H03M 13/05* (2013.01); *G06F 11/1008* (2013.01)

(58) Field of Classification Search
None
See application file for complete search history.

(56) References Cited

U.S. PATENT DOCUMENTS 8,019,959 B2 9/2011 Wu et al.
8,046,660 B2 10/2011 Wu et al.
(Continued)

FOREIGN PATENT DOCUMENTS

CN 101127004 A 2/2008
TW 200912643 A 3/2009
(Continued)

OTHER PUBLICATIONS

U.S. Appl. No. 13/516,053, 2 pages.
(Continued)

*Primary Examiner* — Daniel McMahon
(74) *Attorney, Agent, or Firm* — Francis Lammes; Stephen J. Walder, Jr.; Jeff Tang

(57) ABSTRACT

A mechanism is provided for controlling a solid state storage device in which the solid state storage comprises erasable blocks each comprising a plurality of data write locations. Input data is stored in successive groups of data write locations, each group comprising write locations in a set of erasable blocks in each of a plurality of logical subdivisions of the solid state storage. The input data is error correction encoded such that each group contains an error correction code for the input data in that group. Metadata, indicating the location of input data in the solid state storage, is maintained in memory. An indication of validity of data stored in each data write location is also maintained. Prior to erasing a block, valid input data is recovered from the group containing write locations in that block. The recovered data is then re-stored as new input data.

9 Claims, 5 Drawing Sheets

(56) References Cited

U.S. PATENT DOCUMENTS

| | | | |
|---|---|---|---|
| 8,239,735 | B2 | 8/2012 | Shalvi et al. |
| 8,285,927 | B2 | 10/2012 | Flynn et al. |
| 8,347,138 | B2 * | 1/2013 | Moshayedi ............... 714/6.21 |
| 8,380,919 | B2 * | 2/2013 | Chen ............................ 711/103 |
| 2004/0083333 | A1 | 4/2004 | Chang et al. |
| 2008/0022163 | A1 * | 1/2008 | Tanaka et al. ............... 714/710 |
| 2008/0034272 | A1 | 2/2008 | Wu et al. |
| 2008/0201392 | A1 | 8/2008 | Nakajima et al. |
| 2008/0288814 | A1 | 11/2008 | Kitahara |
| 2008/0320214 | A1 | 12/2008 | Ma et al. |
| 2009/0070651 | A1 | 3/2009 | Diggs et al. |
| 2009/0125671 | A1 | 5/2009 | Flynn et al. |
| 2009/0287956 | A1 | 11/2009 | Flynn et al. |
| 2010/0266120 | A1 | 10/2010 | Leggette et al. |
| 2012/0072807 | A1 | 3/2012 | Carnwell et al. |
| 2012/0260150 | A1 | 10/2012 | Cideciyan et al. |

FOREIGN PATENT DOCUMENTS

| | | |
|---|---|---|
| TW | 200921676 A | 5/2009 |
| WO | WO2009/097705 A1 | 8/2009 |
| WO | WO 2011/073939 A1 | 6/2011 |

OTHER PUBLICATIONS

International Search Report and Written Opinion, International Application No. PCT/IB2010/055874 dated Apr. 20, 2011, 10 pages.

"SSD Controllers by Start-Up SandForce", http://www.storagenewsletter.com/news/flash/sandforce-ssd-controllers, link no longer available, link redirects to http://www.storagenewsletter.com/rubriques/solid-state-ssd-flash-key/sandforce-ssd-controllers/, Press Release edited by StorageNewsletter.com on Apr. 13, 2009, 7 pages.

* cited by examiner

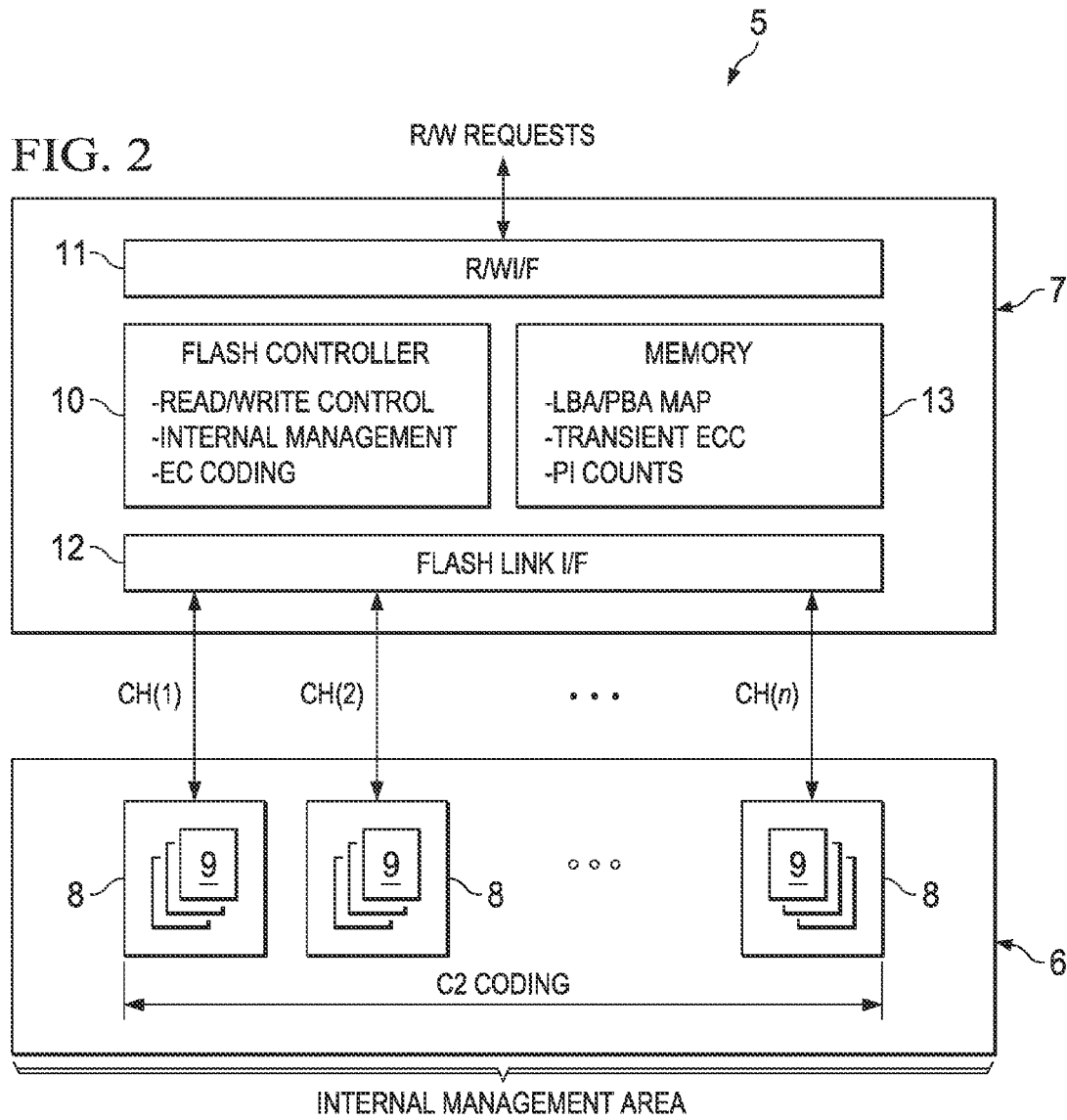

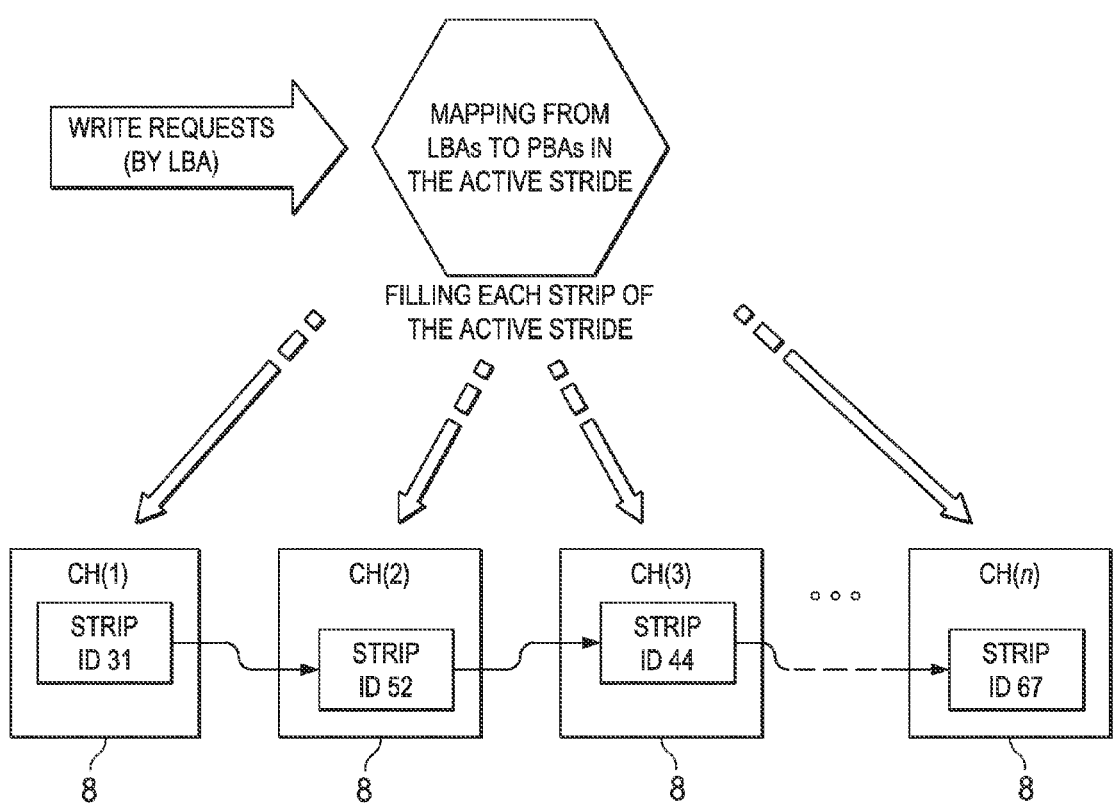

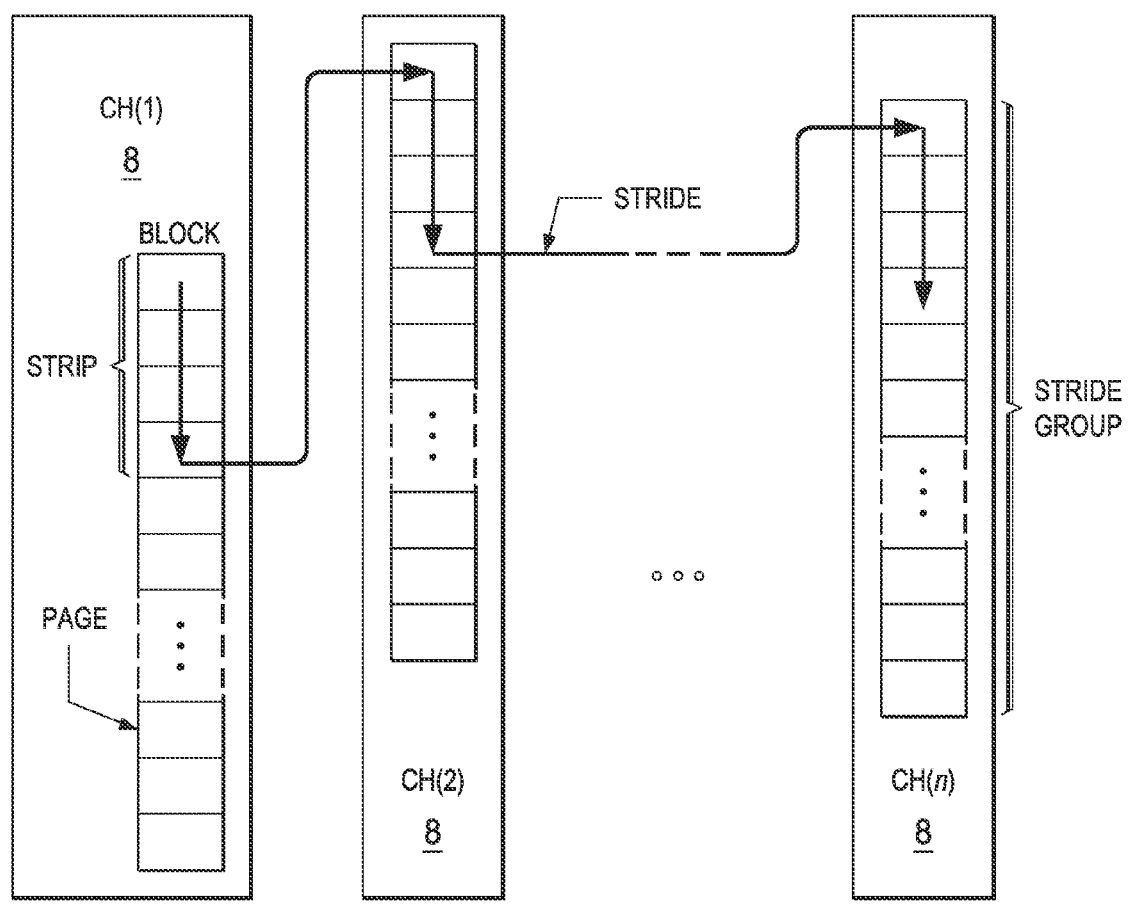

DATA MANAGEMENT IN SOLID STATE STORAGE DEVICES

This application is a continuation of application number 13/516,053, filed Jun. 14, 2012, status awaiting publication.

BACKGROUND

This invention relates generally to data management in solid state storage devices (SSDs), and more particularly to methods and apparatus for controlling data storage and erasing procedures in SSDs.

Solid-state storage is non-volatile memory which uses electronic circuitry, typically in integrated circuits (ICs), for storing data rather than conventional magnetic or optical media like disks and tapes. SSDs such as flash memory devices are currently revolutionizing the data storage landscape. These devices are more rugged than conventional storage devices due to the absence of moving parts, and offer exceptional bandwidth, significant savings in power consumption, and random I/O (input/output) performance that is orders of magnitude better than hard disk drives (HDDs).

In SSDs, the storage is organized into storage areas, or "blocks", each of which contains a set of storage locations to which data can be written. In the following, various operational characteristics of SSDs will be described with particular reference to NAND-based flash memory devices. It will be understood, however, that similar principles apply to other types of SSD. Flash memory, for example, is organized into storage blocks containing data write locations known as "pages". A typical flash page is 4 kB in size, and a typical flash block is made up of 64 flash pages (thus 256 kB). Read and write operations can be performed on a page basis, while erase operations can only be performed on a block basis. Data can only be written to a flash block after it has been successfully erased. It typically takes 15 to 25 μs to read a page from flash cells to a data buffer inside a flash die. Writing a page to flash cells takes about 200 μs, while erasing a flash block normally takes 2 ms or so. Since erasing a block takes much longer than a page read or write, a write scheme known as "write-out-of-place" is used to improve write throughput and latency. With this scheme, a stored data page is not updated in-place in the flash storage. Instead, the updated page is written to another free flash page, and the associated old flash page is marked as invalid by setting a validity flag in the metadata stored as part of each page.

The write-out-of-place scheme, as well as other flash storage characteristics, requires certain "housekeeping" operations to be performed for internal management of the flash storage. For example, as pages are updated and old pages invalidated, a follow-up process is required to eliminate invalid data and release storage locations for new input data. This internal management process is commonly known as "garbage collection". The garbage collection process involves selecting an occupied flash block and recovering all still-valid data from that block. The valid data pages are copied to another place in the flash storage, and the block is then erased. Blocks are typically selected for garbage collection based on the number of invalid pages they contain. However, garbage collection and block erasures can also be performed as part of other internal management processes which involve, in effect, moving data within the solid state storage. Wear-leveling is one example of such an internal management process. This process addresses the wear-out characteristics of flash memory. In particular, flash memory has a finite number of write-erase cycles before the storage integrity begins to deteriorate. Wear-leveling procedures aim to distribute write-erase cycles evenly among all available flash blocks to avoid uneven wear, so lengthening overall lifespan. In particular, wear-leveling functionality governs selecting blocks to which new data should be written according to write-erase cycle counts, and also moving stored data within the flash memory to release blocks with low cycle counts and even out wear.

Data placement and internal management operations are typically performed by dedicated control apparatus, known as a flash controller, which accompanies the flash storage. The flash controller manages data in the flash memory generally, controlling all internal management operations, and maintains address metadata in controller memory to track the location of data in the flash storage. In particular, the flash controller runs an intermediate software level called "LBA-PBA (logical block address—physical block address) mapping" (also known as "flash translation layer" (FTL) or "LPN-FPN (logical page number-flash page number) address mapping". This maintains metadata in the form of an address map which maps the logical addresses associated with input datablocks from upper layers, e.g. a file system or host in a storage system, to physical addresses (flash page numbers) on the flash. This software layer hides the erase-before-write intricacy of flash and supports transparent data writes and updates without intervention of erase operations.

The internal management functions performed in SSDs lead to so-called "write amplification". This arises because data is moved internally in the storage, so the total number of data write operations is amplified in comparison with the original number of data write requests received by the SSD. Write amplification is one of the most critical issues limiting the random write performance and write endurance lifespan in solid-state storage devices. Another key issue is error performance. Error correction (EC) coding is performed in SSDs by adding redundancy at the write-unit level. Specifically, an EC code is computed for the input data written to each page, or each sector within a page, and this EC code is recorded in that page, or sector, with the input data. This coding allows recovery from errors within individual data pages. However, solid state storage systems can employ additional EC coding to protect against failures at the device level. This coding is performed by managing a collection of devices in the manner of a RAID (redundant array of independent devices) array as commonly employed in HDD storage systems. SSD systems employing RAID-like protection are discussed in US Patent Application publication number US 2008/0320214A1, and "SSD Controllers by Start-Up Sandforce". In one scenario, a storage system can employ multiple SSDs, each operating as described above with a controller managing its own local storage. The collection of SSDs can then be managed at a higher level like a RAID array. The basic operating principles of such a system will be illustrated below with reference to FIG. 1 of the accompanying drawings.

FIG. 1 is a schematic block diagram of an exemplary RAID-like SSD-based storage system 1. In this system, multiple SSDs 2 operate under storage controller 3 which services read/write requests received from hosts. Each SSD 2 operates as already described to manage data in its internal storage 4. In general, storage 4 may consist of one or more storage channels each having one or more chips or packages of chips, where each chip may contain one or more solid state storage dies. The host LBA (logical block address) space is logically partitioned in storage controller 3 and one segment of each logical block is allocated to a respective SSD 2. Redundancy is added at this stage to allow addition of RAID parity. Specifically, storage controller 3 EC codes each input host datablock (corresponding to a given host ("global")

LBA), and the resulting RAID parity is added to the host datablock. The parity-coded block is then partitioned by controller 3 into "unit datablocks". Each unit datablock is supplied under an assigned unit LBA (uLBA) to a respective SSD 2 for storage. The mapping of global LBAs (gLBAs) to uLBAs in the set of SSDs is recorded by controller 3 in a gLBA-uLBA mapping table. Each SSD stores its respective unit datablock and records the physical storage location in a uLBA-PBA mapping table as usual. As a result of this process, RAID codewords are distributed across the array of SSDs 2 as illustrated schematically by the shaded section in the figure. This provides an additional level of EC coding which protects against failures at the SSD level. Within each SSD 2, a local controller performs internal management of storage 4 as described above, but this functionality, and the consequent remapping of uLBAs to PBAs, is transparent to storage controller 3 in this architecture.

FIG. 1 illustrates a so-called "outer RAID" configuration where the RAID codewords span multiple SSDs and hence multiple controllers. An "inner RAID" system can also be employed, in addition or alternatively to outer RAID. Inner RAID is implemented within an SSD controller. In the controller, the LBA space is logically partitioned and one segment of each logical block is assigned to a different sub-unit of the overall storage space. Redundancy is again added to allow addition of inner RAID parity, so that inner RAID codewords are partitioned and distributed among the set of sub-units. Specifically, an inner RAID codeword is partitioned into sub-unit datablocks, and each sub-unit datablock is assigned a sub-unit LBA (suLBA) in the address space of a respective sub-unit. The mapping of LBAs to suLBAs is recorded by the controller in a LBA-suLBA address map. Each subunit datablock is then stored in the respective storage sub-unit at a physical storage location which is recorded in a suLBA-PBA mapping table for that unit. This process provides EC coding which protects against failures at the sub-unit level in an SSD. Like outer RAID systems, the controller performs internal management (garbage collection, wear levelling, etc) independently within each storage sub-unit so that this functionality, and the consequent remapping of suLBAs to PBAs, operates at a lower logical level than the RAID coding at the logical block level.

SUMMARY

One aspect of the present invention provides control apparatus for a solid state storage device in which the solid state storage comprises erasable blocks each comprising a plurality of data write locations. The control apparatus comprises memory and control logic adapted to:
  store input data in successive groups of data write locations, each group comprising write locations in a set of erasable blocks in each of a plurality of logical subdivisions of the solid state storage;
  error correction encode the input data such that each said group contains an error correction code for the input data in that group;
  maintain in said memory metadata indicating the location of input data in the solid state storage;
  maintain an indication of validity of data stored in each data write location; and
  prior to erasing a block, to recover valid input data from the or each said group containing write locations in that block and re-store the recovered data as new input data.

In embodiments of this invention, therefore, the storage space managed by the control apparatus is logically partitioned into a plurality of logical subdivisions, and input data is written to groups of write locations which are distributed across these logical subdivisions. Specifically, each group contains, in each logical subdivision, one or more write locations in a set of (one or more) erasable blocks in that subdivision. For the input data in each group, an EC code is computed and stored in the group for that input data. In addition, the block erasing process is adapted to recover valid data on a group basis. When block erasure is required, for example during garbage collection or other internal management functions, then valid data is recovered from the or each group which contains write locations in a given block prior to erasing that block. The valid input data so recovered can then be re-stored as new input data in new EC-coded groups. Hence, embodiments of this invention offer an additional level of EC coding (i.e. on top of any conventional EC coding performed within write locations like the intra-page coding discussed earlier), while allowing internal management functions to be performed for the storage as a whole. Thus, in contrast to the RAID-like systems discussed above which are implemented above the LBA to PBA mapping, the additional EC coding is performed at the physical block (PBA) level rather than the logical block (LBA) level and the entire storage area can be managed as one entity for internal management purposes. By performing EC coding at the physical block level in coordination with the essential internal management functionality, embodiments of the invention provide protection against failures of storage subdivisions in a highly performance-efficient manner. In particular, synergy between the EC coding and internal management processes provides higher error correction rates with significant improvements in overall performance. For example, improved error protection can be achieved without the performance penalties, in terms of increased write amplification and reduced endurance, that would be incurred by further coding at higher levels. Overall, therefore, control apparatus embodying the invention offers exceptional performance in solid state storage devices.

In general, the EC encoding process could be implemented by systematic encoding (where the input data to the encoding process is unchanged by the coding but an EC code is added to obtain the output codeword) or by non-systematic encoding (where the input data to the encoding process is embedded by the coding in the output codeword). Preferably, however, systematic encoding is employed whereby the control logic is adapted to add to the input data stored in each said group an EC code for that input data;

The data write locations of the solid state storage may be flash pages in a flash memory device. In general, however, the write locations could be any regions of the overall storage to which data can be written in a SSD. The storage as a whole could in general comprise any desired configuration of storage items, from a single item such as a chip or die to multiple sets of items. However, a typical SSD will have a plurality of storage channels each providing a storage bank, or site, which typically contains multiple packages of one or more storage chips each with one or more solid state dies. The subdivisions into which the available storage is logically partitioned for EC coding purposes could be any subsets of the overall storage area. For example, in an embodiment where the solid state storage device has a plurality of storage channels each having a set of solid state storage units (where each unit may in general comprise a package, chip, die or any other storage area), each logical subdivision could comprise the set of units in a respective channel. (In general, where a set of items is referred to herein, the set may contain one or more items unless the context requires otherwise). Alternatively, for example, each logical subdivision could comprise a respective storage unit.

For EC coding purposes, input data is stored in groups of write locations where each group contains, in each logical subdivision, one or more write locations in a set of erasable blocks in that subdivision. In preferred embodiments, a group contains a plurality of write locations in each block in each subdivision, the write locations within each block being consecutive (i.e. having consecutive physical addresses). In general, the set of write locations for a group in any one subdivision may contain more or less than the number of write locations in an erasable block. For ease of implementation, however, the number of write locations in each subdivision is preferably an integral factor or integral multiple of the number of write locations in a block. Where the number of write locations for a group in each subdivision is less than the block size, more than one group can share the same block. In this case, internal management operations are significantly simplified if any groups which share a common block in one logical subdivision also share a common block in each logical subdivision.

As described above, the EC code for input data in each group is stored in the group with that input data. In preferred embodiments, however, at successive stages during storage of input data in the write locations of each group, a transient error correction code is computed for the input data then stored in the group. This transient EC code can be used for recovery of partially-completed groups where required. Moreover, the control apparatus is advantageously adapted to store the transient error correction code in the solid state storage in response to interruption of power, whereby the transient code can be preserved in the event of power failure. This provides protection against simultaneous power and storage subdivision failure.

A second aspect of the invention provides a solid state storage device comprising solid state storage, which comprises erasable blocks each comprising a set of data write locations, and control apparatus according to the first aspect of the invention.

A third aspect of the invention provides a method for controlling a solid state storage device in which the solid state storage comprises erasable blocks each comprising a plurality of data write locations. The method comprises:
storing input data in successive groups of data write locations, each group comprising write locations in a set of erasable blocks in each of a plurality of logical subdivisions of the solid state storage;
error correction encoding the input data such that each said group contains an error correction code for the input data in that group;
maintaining in memory of the solid state storage device metadata indicating the location of input data in the solid state storage;
maintaining an indication of validity of data stored in each data write location; and
prior to erasing a block, recovering valid input data from the or each said group containing write locations in that block and re-storing the recovered data as new input data.

The invention also provides a computer program comprising program code means for causing a computer to perform a method according to the third aspect of the invention. It will be understood that the term "computer" is used in the most general sense and includes any device, component or system having a data processing capability for implementing a computer program. Moreover, a computer program embodying the invention may constitute an independent program or may be an element of a larger program, and may be supplied, for example, embodied in a computer-readable medium such as a disk or an electronic transmission for loading in a computer. The program code means of the computer program may comprise any expression, in any language, code or notation, of a set of instructions intended to cause a computer to perform the method in question, either directly or after either or both of (a) conversion to another language, code or notation, and (b) reproduction in a different material form.

In general, where features are described herein with reference to an embodiment of one aspect of the invention, corresponding features may be provided in embodiments of another aspect of the invention.

BRIEF DESCRIPTION OF THE SEVERAL VIEWS OF THE DRAWINGS

Preferred embodiments of the invention will now be described, by way of example, with reference to the accompanying drawings in which:

FIG. 2 is a schematic representation of a solid state storage device embodying the invention;

FIG. 3 illustrates writing of input data to a group of write locations distributed across storage subdivisions in the embodiment of FIG. 2;

FIG. 4 shows one example of the configuration of write locations in a group;

DETAILED DESCRIPTION

Figure 1:
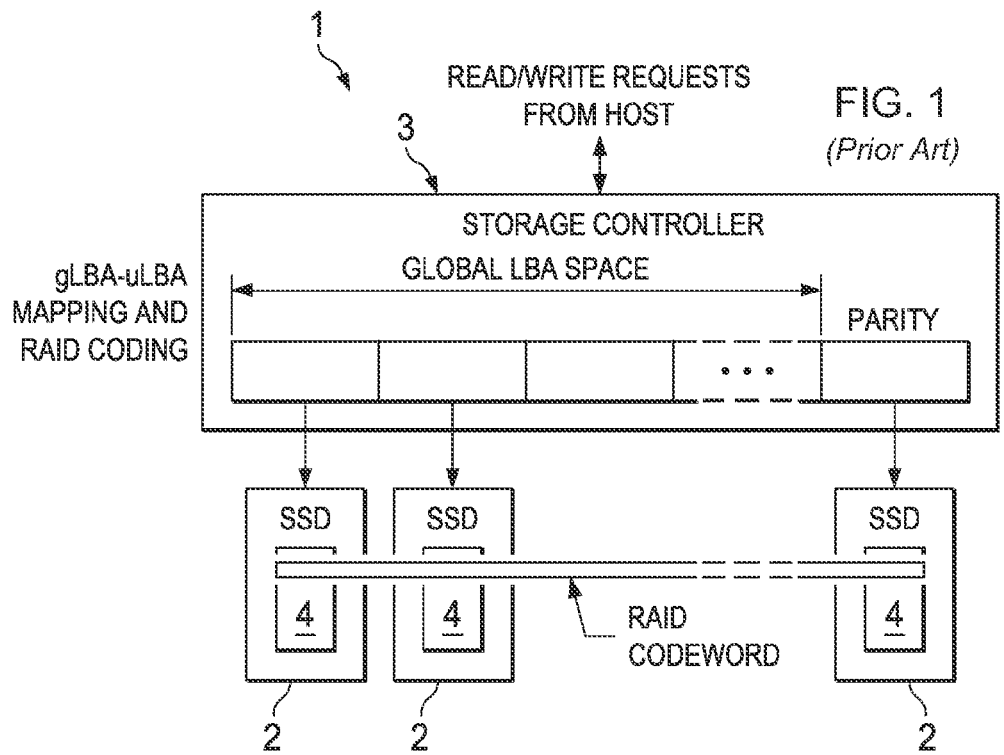
FIG. 1 is a schematic representation of a prior SSD-based storage system with RAID-like coding.

FIG. 2 is a block diagram of an exemplary SSD 5 embodying the invention showing the main elements involved in the data management operations to be described. The SSD 5 has solid state storage 6 and control apparatus indicated generally at 7. In this example, storage 6 consists of n storage channels, Ch(1) to Ch(n), each providing a bank 8 of storage units, here flash storage dies 9. The set of flash dies 9 in each bank 8 can in general be provided on one or more chips or packages of chips, and could comprise SLC (single-level cell) dies, MLC (multi-level cell) dies or a combination thereof. For example, one or more channels may provide MLC storage, the remainder providing SLC storage.

The control apparatus 7 of SSD 5 includes control logic in the form of flash controller 10, a read/write (R/W) interface (I/F) 11 for servicing data read and write requests to the device, and a flash link interface 12 for communication of data with the flash storage channels. Flash controller 10 controls operation of device 5 generally, managing reading and writing of data in response to received requests and handling all internal management functions for flash storage 6. The flash controller 10 also performs EC encoding (and corresponding decoding) of data as described further below. In general, the control logic of flash controller 10 could be implemented in hardware, software or a combination thereof. For example, the control logic could be implemented in whole or in part by software which configures a processor of control apparatus 7 to perform the functions described. Suitable software will be apparent to those skilled in the art from the description herein. The EC encoding/decoding functionality may be implemented by hardwired logic circuits which operate under general control of the flash control logic, and suitable circuits will again be apparent to those skilled in the art. The control apparatus 7 further includes for storage of various metadata in operation of flash controller 10 as described further below. Memory 13 could in general comprise one or more memory components, which may include different types of memory, including for example an SDRAM (synchronous dynamic random access memory).

In general, device 5 could communicate directly with hosts to service read/write requests or could be managed by a higher-level controller which services host requests for a plurality of devices in a storage system. For example, device 5 could form part of a RAID-like array in which multiple SSDs are managed by a storage controller in analogy with the FIG. 1 system. The logical addresses associated with data specified in input read/write requests might therefore refer to the global (host) address space or some logically lower-level address space. These addresses will be referred to simply as LBAs hereinafter.

Data write requests, specifying starting LBA and request size, arrive asynchronously at control apparatus 7 via R/W interface 11. Flash controller 10 controls writing of the input datablocks (corresponding to respective LBAs) to flash storage 6, and performs two layers of EC coding during the write process. The first EC coding layer, referred to hereinafter as "C1 coding", is the conventional coding at the write-unit level. As input data is written to individual flash pages in storage 6, EC coding is performed over the input data and the resulting code (the C1 code) forms part of the metadata stored in that page. This metadata also includes a validity indicator in the form of page-invalid (PI) flag. As part of the normal control operations of flash controller 10, the PI flag for a page can be set by the controller if the data in that page is deemed invalid for some reason, e.g. due to a data update as discussed further below. The page metadata typically also includes a bad-page (BP) flag which can be set by flash controller 10 if a page is determined to be unusable (e.g. shows too many C1 errors). Again this is performed as part of the normal control functions of flash controller 10.

The second layer of EC coding performed by flash controller 10 will be referred to hereinafter as "C2 coding". To implement the C2 coding, the storage area 6 of SSD 5 is logically partitioned by flash controller 10 into a plurality of logical subdivisions. In this example there are n logical subdivisions corresponding to respective storage banks 8 on the set of n channels. The C2 coding is performed by writing the stream of input datablocks to a succession of groups of flash pages. In this embodiment, the pages of each group are distributed across all logical subdivisions of storage 6. Specifically, each group of pages, referred to herein as a "stride", contains a set, or "strip", of pages in the storage area 8 of each channel. Each strip typically consists of a predefined number of consecutive pages, i.e. pages with consecutive PBAs, in one or more flash blocks of the channel storage area 8. Each strip has a unique strip id within the storage area 8. For convenience, the strip id can be the PBA of the first page in the strip.

Input data is stored by writing to each stride in turn, adding redundancy at this stage for the C2 coding. FIG. 3 illustrates this write process for the current active stride. Input data is written to each strip of the stride, with a set of pages in the last strip (in Ch(n)) being reserved for the C2 code for the stride. That is, for the input data in a given stride, the flash controller 10 computes an EC code for that input data and stores this C2 code in the last pages of the stride. The particular EC algorithm used for the C2 coding is not central to the present invention. In this example, however, the C2 code is assumed to be an XOR parity code. (Another C2 coding system which could be employed here is disclosed in our copending European Patent Application, filed concurrently herewith under Applicant's reference CH9-2009-0046, the relevant content of which is incorporated herein by reference. In that system, the C2 code added to a stride as described above comprises the collective parity codes of a plurality of C2 codewords which span the storage subdivisions 8). If, in the write process for a given stride, the flash controller 10 detects a bad page (i.e. the BP flag is set), then this page is passed over and writing continues with the next page in the stride. When computing the C2 parity, any bad pages are deemed by controller 10 to contain all zeros.

Figure 5:
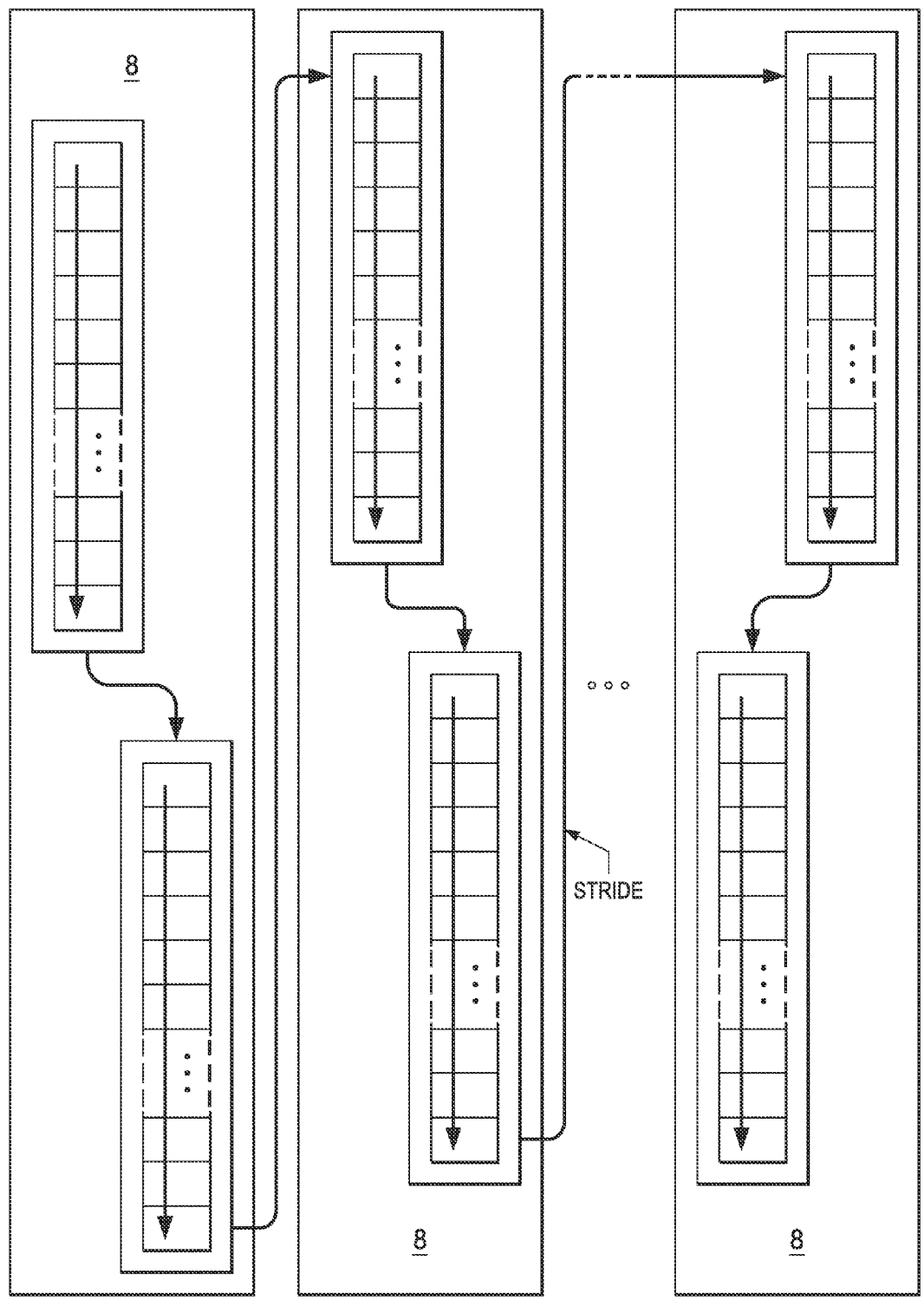
FIG. 5 shows another example of the configuration of write locations in a group.

In general, depending on the system architecture, the strips of a given stride can be filled sequentially or in parallel. In the present embodiment where storage 6 is logically subdivided by channel, strips can be written in parallel to the n channels. In this case, flash controller 10 checks for bad pages in the active stride before allocating the input data to strips and computing the C2 parity for the stride. In any case, it will be seen that the effect of the data write process is to distribute the input data across the storage channels of device 5 in C2-coded strides. The allocation of strips to particular strides, and the order of stride selection in a write operation, can be implemented in various ways in controller 10 and suitable implementations will be apparent to those skilled in the art. These features are not central to the present invention and need not be discussed in detail here. In general, however, each strip contains pages in one or more flash blocks in a given channel. FIGS. 4 and 5 show two examples of possible stride configurations. In FIG. 4, the C2 strip size is four pages. A single stride is indicated by the arrows in the figure. Assuming a flash block size of 64 pages, then each block will contain strips of 16 different strides. These 16 strides share the same blocks in all channels. Such a set of strides which share a common set of blocks is referred to hereinafter as a stride group. Note that blocks of the same stride group in different channel storage areas 8 need not be physically aligned. FIG. 5 shows an alternative example where the C2 strip size is two blocks. Each stride thus consists of two blocks in each storage channel, and a stride group here consists of a single stride. Note that blocks of the same stride in each channel storage area 8 need not be physically consecutive.

Storage controller 10 records the location of input data in the storage 6 via address metadata which is maintained by controller 10 in memory 13. The address metadata here comprises an LBA/PBA address map indicating the mapping between logical addresses (LBAs) associated with input datablocks and physical addresses (PBAs) in storage 6. Such an address map may in general comprise one or more tables or other data structures from which the physical locations of the strides, and the strips they contain, in which input datablocks are stored can be determined. For example, the address map could specify the mapping of LBAs to stride ids in one table and the mapping of stride ids to strip ids in another table, with a further table indicating the PBA in a strip at which each LBA can be found. In practice, however, a single lookup table containing all address metadata may be preferred for simplicity.

It will be appreciated that, by distributing the input data across the storage channels in EC-coded strides, the C2 coding process provides additional protection against errors in individual channels over and above the page-level protection of the C1 coding. Error checking is typically performed after each data write, as well as on read-out of data in response to a read request or during internal management operations discussed below. Whenever a strip contains page or block errors that cannot be corrected by the C1 error correction process, the following procedure is performed by flash controller 10. A new strip is selected from the same storage area 8 as the strip containing the error. This strip will replace the "bad strip" in the stride in question. The other strips in the stride are identified from the address metadata in memory 13, and the content of these strips is read. The content of the bad strip is read, and the content of the other strips in the stride is used to reconstruct erroneous data in the bad strip via the C2 coding algorithm. The reconstructed (error-corrected) data is then written to the replacement strip and the address metadata is updated to reflect the modified stride structure. The page-invalid (PI) flag is then set in each page of the old, bad strip to indicate that the content of these pages is invalid. These pages will be recycled during a subsequent garbage collection process described below.

As well as storing the C2 codes as part of the strides in storage 6, flash controller also computes partial C2 codes during writing of individual strides. These partial codes are computed at successive stages during writing of input data in the strips of each stride, preferably after writing each page of a strip. Specifically, after each page-write, the C2 coding is applied to the input data stored thus far in the stride to obtain a transient EC code, or "transient parity", for the partially-completed stride. This transient parity is stored by controller 10 as indicated in memory 13 in FIG. 2. In practice, the particular memory component which stores the transient parity may be a register of a hard-wired C2 encoder circuit. This transient parity can be used when required to recover from errors in partially completed strides. In addition, if flash controller 10 detects an interruption in the power supply to control apparatus 7, the controller copies the transient error correction code (together with the other metadata, including the current address map, in memory 13) into an available region of flash storage 6 before shut-down. The transient parity can thus be preserved in the event of a power failure, providing protection against simultaneous power failure and storage unit/channel errors.

As data is updated in flash storage 6 using the write-out-of-place scheme explained earlier, flash controller 10 sets the page-invalid (PI) flag for any page which has been updated by an LBA overwrite. The PI flag is similarly set for pages containing data deleted by a host. Storage controller 10 also maintains a count for each stride group indicative of the number of invalid pages in the whole of that stride group. These PI counts for stride groups are recorded as part of the metadata maintained in memory 13. The PI counts are used during internal management operations performed by controller 10 as described further below.

Although storage 6 is logically subdivided for the C2 coding described above, internal management functions are performed for the storage as a whole. That is, flash controller 10 treats all subdivisions (the n storage channels) as a single storage entity for internal management purposes. To this end, internal management functions which involve erasing blocks, such as garbage collection and wear-levelling, are adapted to account for the cross-subdivision C2 coding. In particular, the recovery of valid data during such processes is performed on a stride group basis rather than a block basis. Before a block is erased, valid input data is recovered from each stride in the stride group containing write locations in that block. This operation is described in more detail below with reference to FIG. 6 for the garbage collection process.

Figure 6:
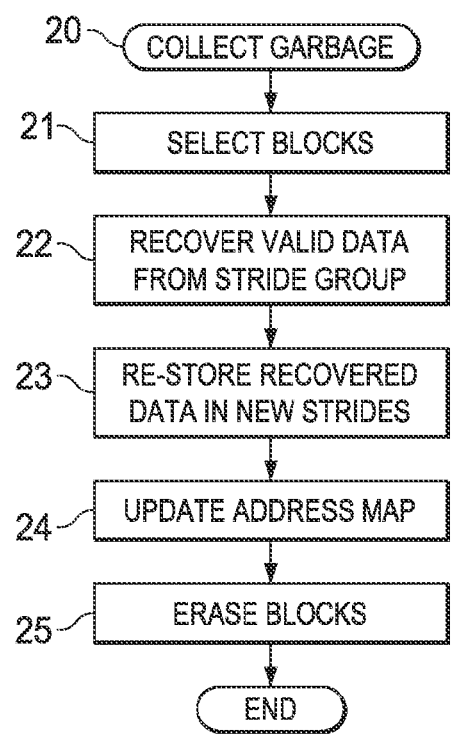
FIG. 6 illustrates an internal management process performed in the SSD of FIG. 2.

The block diagram of FIG. 6 shows key steps in the garbage collection process performed in SSD 5. When garbage collection is initiated (represented by step 20 in the figure), flash controller 10 first selects the blocks which are to be erased. This selection, performed at step 21, is based on the PI counts stored in memory 13 for stride groups. In particular, the blocks in stride groups with the highest PI counts can be selected for recycling first. Having selected a stride group, in step 22 flash controller recovers all still-valid data from the pages of that stride group. Thus, data is read from all pages in the stride group for which the respective PI flags are not set. Error correction processing, based on the C1 and C2 codes, can be performed as required in this process. The valid data so recovered is then fed back as input data to be re-stored in flash storage 6. Thus, recovered data is re-stored in new strides as indicated at step 23. In step 24, flash controller 10 updates the address map in memory 13 to reflect the new data locations. The blocks of the old, recycled stride group can then be erased by flash controller 10 as indicated by step 25. Block erasures may be performed immediately or at any subsequent time by controller 10 to release these blocks for storage of new data.

It will be seen from the above that all strips of a stride group are recycled together during garbage collection. The same principle can be applied in any internal management process, such as wear-levelling for example, involving moving data within the flash prior to block erasures. As part of the normal monitoring functionality of controller 10, blocks which show endurance problems (too many C1 errors) can be identified and flagged as "bad blocks" during the recycling process. This flagging can be based on a block error count maintained by flash controller 10 as part of the metadata stored in memory 13. Blocks which are tagged as bad in this way are not used by controller 10 for subsequent data placement.

It will be understood from the foregoing that, unlike prior RAID-like systems, the C2 coding is performed at the physical block level in SSD 5 with the entire storage area being managed as one entity for internal management purposes. The C2 coding operation, being performed at the PBA level, is transparent to the LBA/PBA mapping, and offers protection against complete failures taking place at the page, block, chip, bank and channel levels. The use of transient C2 codes as described above also provides resistance against simultaneous power and unit failure. By performing the C2 coding in a synergistic fashion with internal management functionality as described above, SSD 5 achieves improved error rates with exceptional overall performance. In particular, error performance is enhanced without the write amplification and endurance penalties of higher-level coding. By way of illustration, the SSD 5 can be compared to a RAID-like SSD-based system of the type described earlier by assuming that one channel is used for redundancy in each case. In SSD 5, assuming channel n is entirely allocated to C2 codes, we define $w_1$ as the write amplification due to internal management (garbage collection and wear-levelling). If we assume for simplicity that each strip contains one page only, then each page-write leads to $(1+1/(n-1))w_1$ page-writes as the controller computes a parity page for $(n-1)$ pages, one from each channel. In contrast, with the RAID-like system, if $w_2$ denotes the write amplification due to garbage collection and wear-levelling, then each page-write leads to $2w_2$ page-writes, one data page and one RAID parity page. Moreover, $w_1 < w_2$ because the internal management is performed "globally", treating all storage channels as a unified storage area.

Efficiency may be improved even further by appropriate selection of C2 stride and strip sizes, and the relationship of strip size to LBA size, in a given case. Such considerations are similar to those encountered in RAID applications as will be apparent to those skilled in the art. In some embodiments of the invention, the flash controller may be adapted to adjust the C2 strip and stride size dynamically in operation. For instance, the flash controller could switch between different strip/stride sizes in dependence on predetermined criteria, for example depending on the size of a write request. Stride length might also be reduced as the blocks become more and more unreliable, e.g. due to wear and aging. Appropriate modifications to the embodiment described will be apparent to those skilled in the art.

It will be appreciated that numerous further changes and modifications can be made to the above embodiments. By way of example, while the logical subdivisions of storage 6 for C2 coding are aligned with the storage channels in SSD 5, in general these subdivisions could be any subset of the available storage. For instance, the subdivisions could alternatively consist of respective flash dies 9 in FIG. 2. The C2 codes could of course be stored in any storage subdivision and this need not be the same for all strides. Moreover, individual C2 codewords need not necessarily span all subdivisions. In device 5, for example, the C2 strides could alternatively span a plurality of channels less than the total number n, the collection of strides as a whole being distributed across all channels. In this case, when a new strip is selected to replace a bad strip in the C2 error-correction process, the new strip can be selected from the same storage channel or any other channel which does not already contain a strip of the same stride. Stride length might also be reduced so that strides span fewer channels when blocks become unreliable as mentioned above.

The provision of C1 coding, while of course desirable, is not necessary for operation of embodiments of the invention. In addition, while a NAND flash device has been particularly described, the invention can of course be applied to other types of SSD.

Many other changes and modifications can be made to the exemplary embodiments described without departing from the scope of the invention.

The invention claimed is:

1. A method for controlling a solid state storage device in which a solid state storage in the solid state storage device comprises erasable blocks each erasable block comprising a plurality of data write locations, the method comprising:

storing input data in successive groups of data write locations, each group of data write locations in the successive groups of data write locations comprising write locations in a set of erasable blocks in each of a plurality of logical subdivisions of the solid state storage;

error correction encoding the input data such that each group of data write locations contains an error correction code for the input data in that group of data write locations;

maintaining, in memory of the solid state storage device, metadata indicating a location of the input data in the solid state storage;

maintaining an indication of validity of data stored in each data write location;

prior to erasing an erasable block, selecting an erasable block from the set of erasable blocks for erasing in dependence on a number of write locations containing invalid data in the group of data write locations which contain write locations in that erasable block; and recovering valid data from each group of data write locations containing write locations in that erasable block thereby forming recovered valid data and re-store the recovered valid data as new input data.

2. The method as claimed in claim 1, further comprising:

at successive stages during storage of the input data in the write locations of each group of data write locations, computing a transient error correction code for the input data stored therein.

3. The method as claimed in claim 2, further comprising:

storing the transient error correction code in the solid state storage in response to interruption of power to the solid state storage device.

4. The method as claimed in claim 1, wherein the solid state storage device has a plurality of storage channels each having a set of solid state storage units, and wherein each of the logical subdivisions comprises the set of solid state storage units in a respective channel.

5. The method as claimed in claim 1, wherein the solid state storage comprises a plurality of storage units and each of the logical subdivisions comprises a respective storage unit.

6. The method as claimed in claim 1, wherein each group of data write locations comprises a set of consecutive write locations in each erasable block of the group of data write locations.

7. The method as claimed in claim 1, wherein any groups of data write locations which share a common block in one logical subdivision share a common block in each logical subdivision.

8. The method as claimed in claim 1, further comprising:

dynamically adjusting a number of write locations in a group of data write locations in the successive groups of data write locations in dependence on predetermined criteria.

9. The method as claimed in claim 1, wherein the metadata comprises an address map indicating a mapping between logical addresses associated with respective input data blocks and physical addresses indicative of write locations in the solid state storage.

\* \* \* \* \*